United States Patent
Chun et al.

(10) Patent No.: US 9,274,888 B2
(45) Date of Patent: Mar. 1, 2016

(54) METHOD AND APPARATUS FOR MULTIPLE-BIT DRAM ERROR RECOVERY

(71) Applicant: QUALCOMM Incorporated, San Diego, CA (US)

(72) Inventors: Dexter Tamio Chun, San Diego, CA (US); Jung Pill Kim, San Diego, CA (US); Hyunsuk Shin, San Diego, CA (US); Jungwon Suh, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/081,645

(22) Filed: Nov. 15, 2013

(65) Prior Publication Data

US 2015/0143198 A1     May 21, 2015

(51) Int. Cl.
*G11C 29/00* (2006.01)
*G06F 11/10* (2006.01)
*G06F 11/14* (2006.01)

(52) U.S. Cl.
CPC ........ *G06F 11/1072* (2013.01); *G06F 11/1048* (2013.01); *G06F 11/14* (2013.01); *G11C 29/765* (2013.01)

(58) Field of Classification Search
None
See application file for complete search history.

(56) References Cited

U.S. PATENT DOCUMENTS

| | | | |
|---|---|---|---|
| 7,975,170 B2 | 7/2011 | Hummler et al. | |
| 2001/0024386 A1* | 9/2001 | Harari et al. | 365/200 |
| 2001/0026472 A1* | 10/2001 | Harari et al. | 365/185.03 |
| 2005/0005192 A1* | 1/2005 | Hsu | 714/5 |
| 2005/0028054 A1* | 2/2005 | Roohparvar | 714/710 |
| 2007/0276996 A1* | 11/2007 | Caulkins et al. | 711/113 |
| 2008/0133827 A1* | 6/2008 | Topham et al. | 711/111 |
| 2009/0172267 A1 | 7/2009 | Oribe et al. | |
| 2009/0282300 A1 | 11/2009 | Heyrman et al. | |
| 2011/0010582 A1* | 1/2011 | Tsukamoto et al. | 714/14 |
| 2012/0099389 A1 | 4/2012 | Park et al. | |
| 2012/0221773 A1 | 8/2012 | Shuto et al. | |
| 2012/0254463 A1 | 10/2012 | Patoskie | |
| 2012/0317352 A1 | 12/2012 | Kang et al. | |
| 2015/0058533 A1* | 2/2015 | El-Batal et al. | 711/103 |

OTHER PUBLICATIONS

International Search Report and Written Opinion—PCT/US2014/065809—ISA/EPO—Jan. 30, 2015.
Liu S., et al., "Flikker: Saving DRAM Refresh-power through Critical Data Partitioning," 16th International Conference on Architectural Support for Programming Languages and Operating Systems (ASPLOS), ACM, Mar. 5-11, 2011, pp. 1-12.

* cited by examiner

*Primary Examiner* — Daniel McMahon
(74) *Attorney, Agent, or Firm* — Muncy, Geissler, Olds & Lowe, P.C.

(57) ABSTRACT

A system for replacing a page stored in system memory when reading the page incurs a multiple-bit error. Upon reading a page in system memory for which a multiple-bit error is detected, backup data in flash memory is loaded into a redundant page in the system memory, and a re-mapper is configured so that future accesses to the page are redirected to the redundant page.

20 Claims, 9 Drawing Sheets

METHOD AND APPARATUS FOR MULTIPLE-BIT DRAM ERROR RECOVERY

FIELD OF DISCLOSURE

Embodiments pertain to electronic memory, and more particularly to recovering from bit errors when reading from system memory.

BACKGROUND

DRAM (Dynamic Random Access Memory) technology will eventually scale down to less than 20 nm feature size, leading to a decrease in memory cell capacitance and an increase in cell transistor leakage. The probability distribution of memory cell retention in system memory may be modeled by a normal distribution, but decreasing the feature size does not necessarily tighten the normal distribution, that is, the distribution will continue to exhibit tails with cells having a significantly reduced cell retention compared to the mean cell retention associated with the distribution.

Conventional techniques to address reduced cell retention include increasing the frequency of refresh operations. However, increasing the refresh frequency adversely impacts the available memory bandwidth and leads to an increase in standby power consumption. Alternatively, another conventional technique to address the issue of reduced cell retention is to employ an error recovery scheme such as block error correction (of codewords) used along with a refresh operation to read-correct-write the stored data. However, multiple-bit errors may occur within a codeword. Furthermore, multiple-bit error correction may adversely impact the DRAM die area.

SUMMARY

Embodiments of the invention are directed to systems and methods for multiple-bit dram error recovery.

In an embodiment, a system includes a system memory comprising an error detection circuit, the system memory comprising volatile memory; a controller coupled to the system memory; a processor coupled to the controller; a re-mapper coupled to the processor and the system memory, the re-mapper to store mappings of page addresses; a non-volatile memory; and a memory comprising stored instructions. In response to the error detection circuit detecting a multiple-bit error in a page residing in the system memory, where the page has a first physical address, the stored instructions when executed by the processor cause the system to perform a procedure comprising: looking up in a page table if a golden page associated with the first physical address resides in the non-volatile memory; copying the golden page to a redundant page in the system memory provided the golden page resides in the non-volatile memory, the redundant page having a second physical address; and configuring the re-mapper to map the first physical address to the second physical address when the processor performs a memory operation indicating the first physical address, wherein the re-mapper provides the second physical address to the system memory.

In another embodiment, a non-transitory computer-readable memory comprises stored instructions. When executed by a processor in response to an error detection circuit detecting a multiple-bit error in a page residing in a volatile memory, a system performs a method comprising: looking up in a page table stored in the volatile memory if a golden page associated with a physical address of the page resides in a non-volatile memory; copying the golden page to a redundant page in the volatile memory provided the golden page resides in the non-volatile memory; and configuring a re-mapper to map the physical address of the page to a physical address of the redundant page when the processor performs a memory operation indicating the physical address of the page, wherein the re-mapper provides the physical address of the redundant page to the volatile memory.

In another embodiment, a method comprises: detecting by an error detection circuit a multiple-bit error in a page residing in a volatile memory; looking up in a page table stored in the volatile memory if a golden page associated with a physical address of the page resides in a non-volatile memory; copying the golden page to a redundant page in the volatile memory provided the golden page resides in the non-volatile memory; and configuring a re-mapper to map the physical address of the page to a physical address of the redundant page when a memory operation on the volatile memory indicates the physical address of the page, wherein the re-mapper provides the physical address of the redundant page to the volatile memory.

In another embodiment, a method comprises: detecting by an error detection circuit a multiple-bit error in a page residing in a volatile memory; means for looking up in a page table to determine if a golden page associated with a physical address of the page resides in a non-volatile memory; copying the golden page to a redundant page in the volatile memory provided the golden page resides in the non-volatile memory; and means for mapping the physical address of the page to a physical address of the redundant page when a memory operation on the volatile memory indicates the physical address of the page, wherein the means for mapping provides the physical address of the redundant page to the volatile memory.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that specific circuits (e.g., application specific integrated circuits (ASICs)), one or more processors executing program instructions, or a combination of both, may perform the various actions described herein. Additionally, the sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
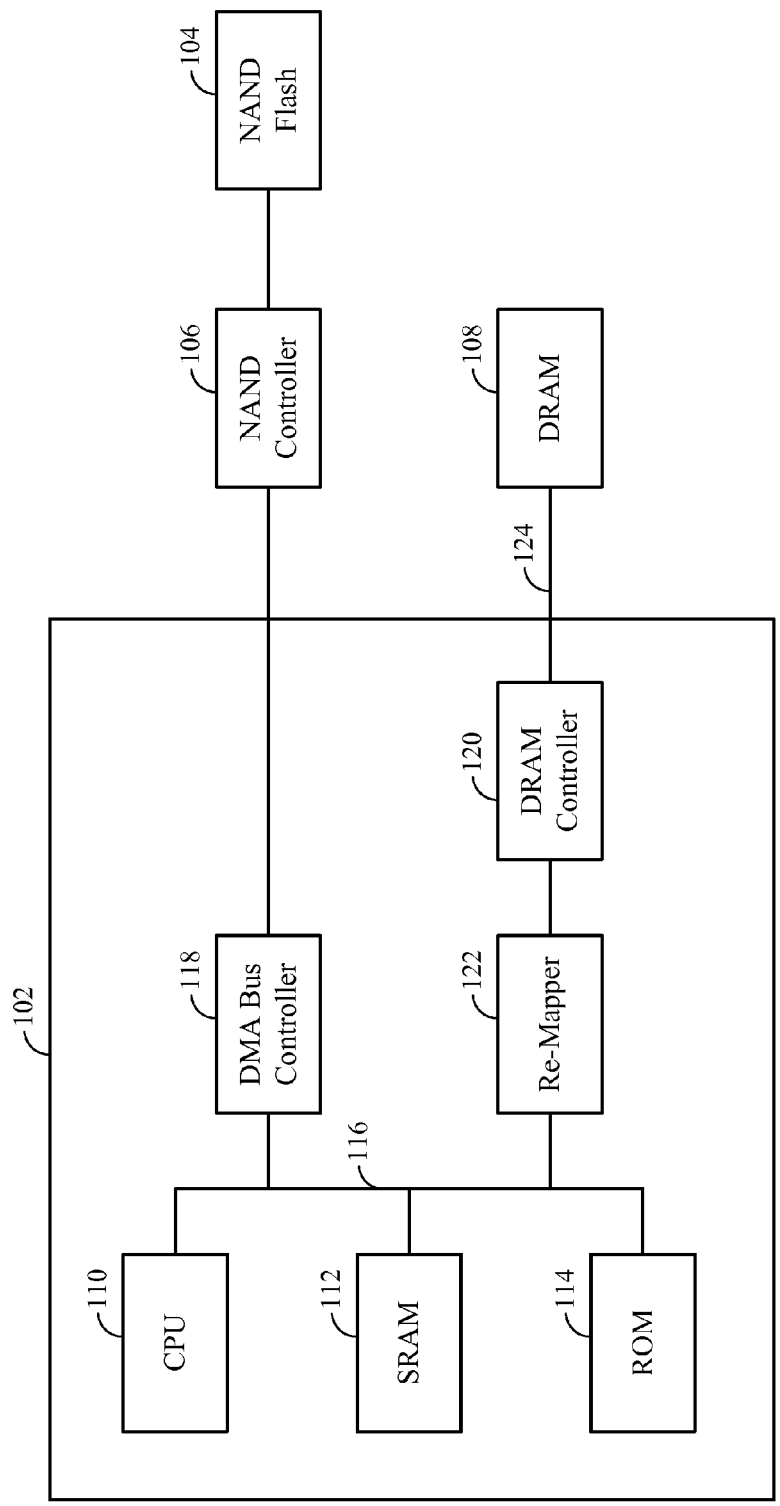
FIG. 1 illustrates a system according to an embodiment.

FIG. 1 illustrates a system according to an embodiment. The system may be integrated on a single chip (die), or the system may include more than one distinct chip. In the particular example of FIG. 1, the system depicted in FIG. 1 includes multiple chips (dice), where one chip comprises the SOC (System-On-Chip) 102, another chip comprises the flash memory 104 labeled as NAND Flash and its associated controller 106 labeled as NAND controller, and one or more chips comprise the system memory 108 labeled as DRAM. The system memory 108 comprises volatile memory. The SOC 102 includes well-known components, such as the CPU (Central Processing Unit) 110, the SRAM (Static Random Access Memory) 112, the ROM (Read Only Memory) 114, the system bus 116, the DMA (Direct Memory Access) bus controller 118, and the DRAM controller 120 for interfacing with the system memory 108. Because multiple processors may be used to implement the CPU 110, the CPU 110 may be interpreted as including one or more processors.

In addition to the components described above is the functional unit 122, referred to as a re-mapper. The re-mapper 122 maps a physical page address provided at its input port to another physical page address provided at its output port, where the physical page address at its output port is provided as input to the DRAM controller 120. The page address provided as input to the re-mapper 122 may be referred to as an intermediate physical page address. A memory operation performed by the CPU 110 indicating an intermediate page address is transparently mapped, or re-directed, to another physical page address as provided by the re-mapper 122. The re-mapper 122 and its mappings (re-directions) are discussed in more detail later.

In practice, a single-bit error correction code is used to detect and correct single-bit errors during memory read operations. For the discussion to follow, assume that a single-bit error correction code is used in an embodiment, but where the decoding scheme can detect multiple-bit errors. Of course, not all multiple-bit errors may be detectable. For example, in a linear code, any multiple-bit error that matches a codeword is not detectable. However, to simplify the discussion, it may be assumed that such multiple-bit error patterns are unlikely, and need not be of concern here.

Data stored in the system memory 108 may viewed as comprising two parts: a first part that is backed up in the flash memory 104, and a second part that is not backed up in the flash memory 104. One may further conceptually divide the backed up data into two types: a type A that includes instructions and read-only data that is not dynamically updated, and a type B that includes dynamically updated data. Dynamically updated data that is not backed up in the flash memory 104 may be referred to as type C data.

Embodiments may store some types of data in portions of the system memory 108 for which a relatively fast refresh rate is performed, and other types of data in portions of the system memory 108 for which a relatively slow refresh rate is performed. Furthermore, production tests performed on DRAM memories may reveal statistics such as retention failure rate versus refresh rate, and in particular the mean and variance of the retention failure rate. The CPU 110 and the reprogrammable DRAM controller 120 may leverage this statistical information by establishing two or more bins of arbitrary size within one or many DRAM memories. A bin that is refreshed at a fast rate may be defined as a good bin, and a bin that is refreshed at a slow refresh rate may be defined as a poor bin. Accordingly, embodiments may store some types of data in good bins, and other types of data in poor bins.

As an example, embodiments may place type C data in good bins having the fast refresh rate. Following the placement of type C data, type A data and type B data may be at first placed into good bins, provided there are good bins available, and then placed into poor bins when good bins are unavailable. That is, type C data gets preference over type A data and type B data when allocating good bins. Continuing with this example embodiment, type C data may be placed in those portions of the system memory 108 in which the fast refresh rate applies. Type A data and type B data may then be placed in the fast refresh rate portions of the system memory 108 provided such portions of memory are available.

Figure 2:
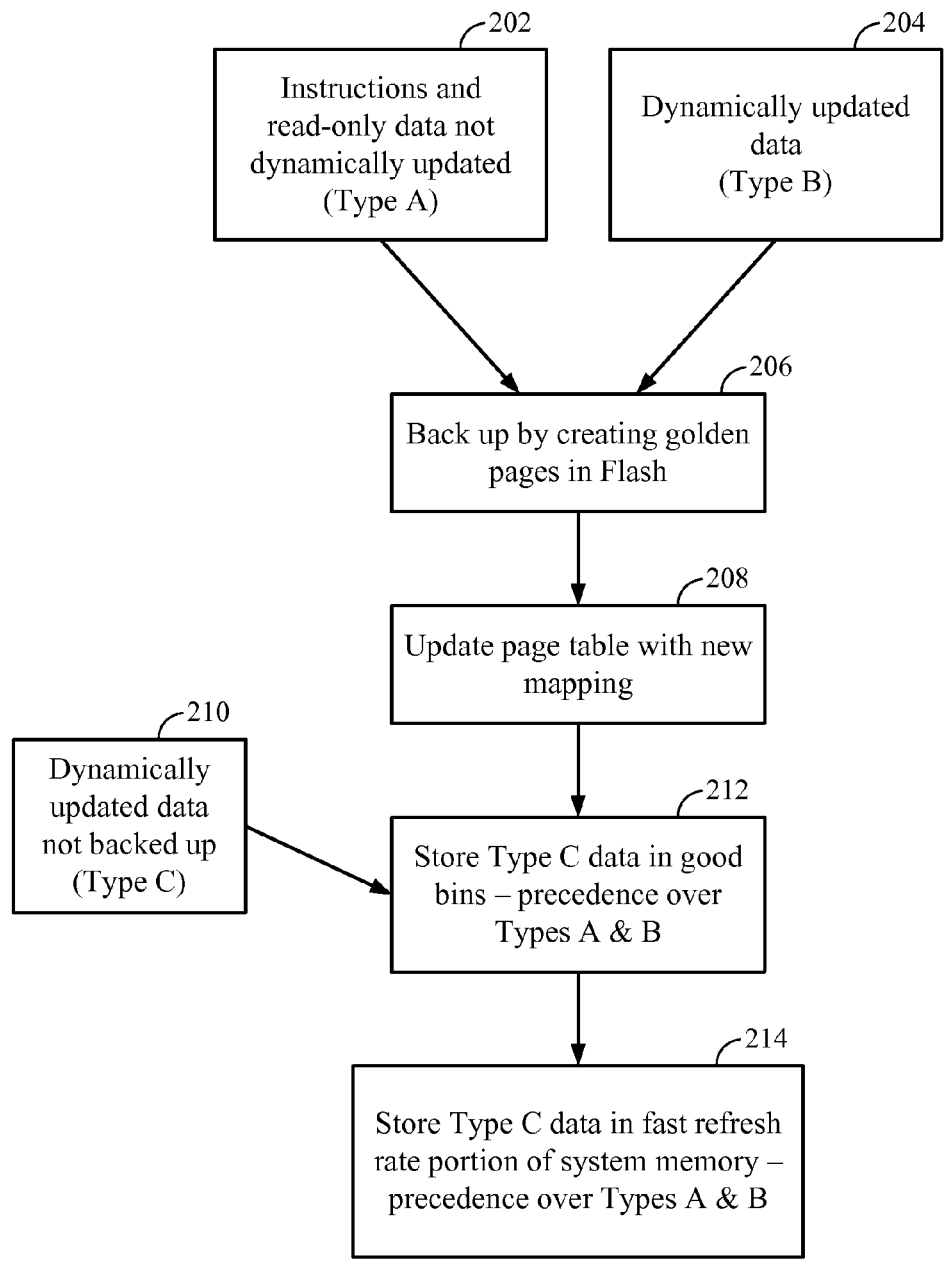
FIG. 2 is a flow diagram illustrating a process to store data in system memory according to an embodiment.

FIG. 2 is a flow diagram illustrating the above-described process. Blocks 202 and 204 define the type A data and the type B data as previously described. Block 206 indicates that for the type A data and the type B data, golden pages are created in flash memory so as to provide backup data. Block 208 indicates that the operating system's page tables are updated to indicate the newly created mappings of physical page addresses in system memory to corresponding physical page addresses in non-volatile (e.g., NAND flash) memory.

Block 210 defines the type C data as described previously. Block 212 indicates that the type C data is stored in the good bins of system memory, provided such bins are available, and that this takes precedence over the type A data and type B data when storing data in the good bins. Block 214 indicates that the type C data is stored in the high refresh rate portions of system memory, provided such memory locations are available, and that this takes precedence over the type A data and type B data when storing data in the high refresh rate portions.

Embodiments are now described with regard to accessing data in the slow refresh rate portion of the system memory 108. When the system memory 108 detects a multiple-bit error while the CPU 110 is executing a read operation on the system memory (DRAM) 108, the system memory 108 sends an error flag over the DRAM bus 124. In response to this error flag, the DRAM controller 120 causes (perhaps by way of a bus arbiter) suspension of normal traffic on the system bus 116, and the CPU 110 breaks away from program flow and executes a handler associated with the error flag. The CPU 110 begins execution of the handler by loading instructions from on-chip memory, such as for example the SRAM 112 or the ROM 114.

When executing the exception handler, the CPU 110 causes the system of FIG. 1 to perform the following process. The DRAM controller 120 is queried to obtain the physical address of the page associated with the detected multiple-bit error. This page may be termed the old page. Using this physical page address, the CPU 110 locates the corresponding virtual page address within the operating system's page tables that map virtual addresses to physical addresses. These page tables are considered type C data and reside in the DRAM system memory 108. A page table entry also includes a flag indicating whether a page has a backup copy in the flash memory 104. If there is such a backup in a page table entry, then the page table entry also includes a mapping (page address) to the location in the flash memory 104 where the backup copy is stored. This back up copy page in the flash memory 104 is termed the golden page because it represents a clean copy of the old page that was stored in the system memory 108.

The CPU 110 copies the golden page from the flash memory 104 to another page in the system memory 108. This other page may be termed a redundant page. The CPU 110 configures the re-mapper 122 to reroute DRAM traffic for the old page to the redundant page. The CPU 100 updates a re-map table stored in the NAND controller 106 and the Flash 104. This re-map table provides the mapping of error-detected page addresses to redundant page addresses, and is needed so that after power-down, the mappings are available during boot up. The CPU 110 then exits from the handler and returns to a point in the program where the exception occurred. Because the failing page is both re-mapped to a redundant page and its contents filled with the data from its corresponding golden page from the flash memory 104, the data recovery is successful.

The above description assumed that the page in the system memory 108 for which a multiple-bit error is detected was backed up in the flash memory 104. If no such backup (golden page) exists, then the above steps associated with the golden page are not performed. However, this scenario may be avoided (or at least made very unlikely) by ensuring that type C non-backed pages are only placed into good DRAM bins.

Figure 3:
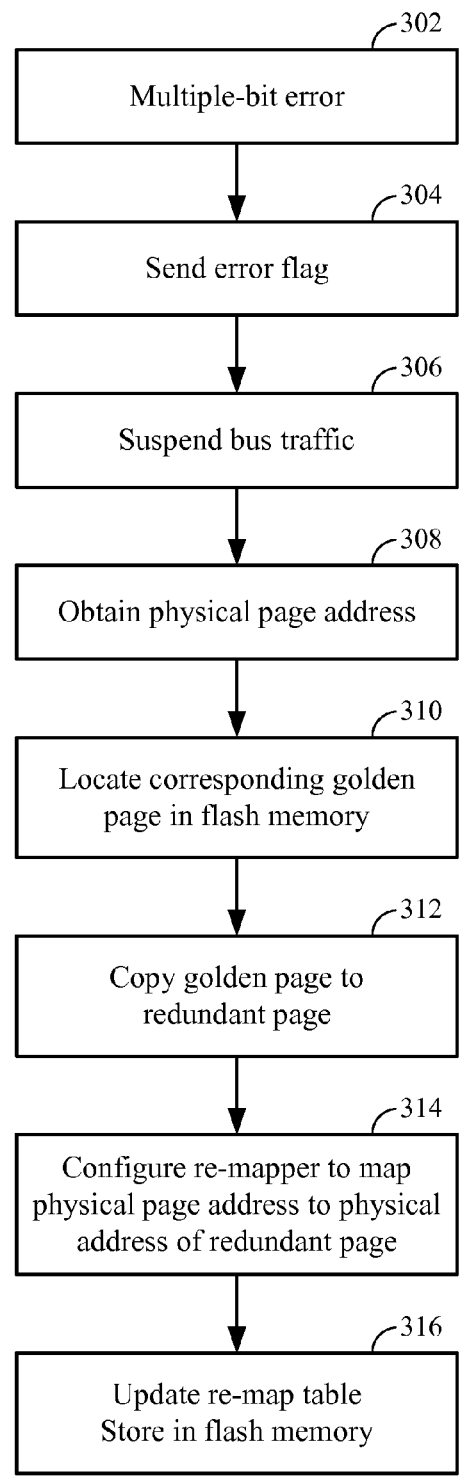
FIG. 3 is a flow diagram illustrating a process to restore pages and re-map page addresses according to an embodiment.

FIG. 3 is a flow diagram illustrating the above-described process for the case of slow refresh rate system memory. When a multiple-bit error is detected during a read operation on system memory (302), the system memory sends an error flag (304) and normal traffic is suspended on the system bus (306). The physical page address associated with the multiple-bit error is obtained (308) and the address of the corresponding golden page in the non-volatile memory is located (310). The golden page is copied into a redundant page in system memory (312), and the re-mapper 122 is configured so that the physical page address associated with the multiple-bit error is now mapped to the physical address of the redundant page (314). The re-map table in the non-volatile memory is updated to reflect this new mapping (316).

Embodiments may also be described regarding data stored in the high refresh rate portions of the system memory 108. For such data, it is expected that errors should be relatively rare, particularly for type C data stored in the good bins. As a result, embodiments may be described as preemptive in the sense that re-mapping is applied to those pages for which single-bit errors occur, even though such single-bit errors are easily corrected by a block code. The motivation for this is that single-bit errors for a page may eventually progress to multiple-bit errors.

Accordingly, for such an embodiment, when the system memory 108 detects and corrects a single-bit error while the CPU 110 is executing a read operation on the system memory (DRAM) 108, the system memory 108 sends an error flag over the DRAM bus 124. As discussed earlier with respect to the slow refresh rate portion of system memory, in response to the error flag, normal traffic on the system bus 116 is suspended, and the CPU 110 breaks away from program flow and executes a handler associated with the error flag.

When executing the exception handler, the CPU 110 causes the system of FIG. 1 to perform the following process. The DRAM controller 120 is queried to obtain the physical address of the page associated with the corrected single-bit error. The CPU 110 copies the entire contents of the corrected page to a redundant page. The CPU 110 then configures the re-mapper 122 to reroute DRAM traffic for the page associated with the single-bit error to the redundant page in the system memory 108. The CPU 100 updates the re-map table stored in the flash memory 104. The re-map table provides mappings of error prone physical page addresses to redundant physical page addresses. The CPU 110 then exits from the handler and returns to the point in the program where the exception occurred. Because there is only a single-bit error that has been corrected, the CPU 110 is not required to access a golden page from the flash memory 104.

Figure 4:
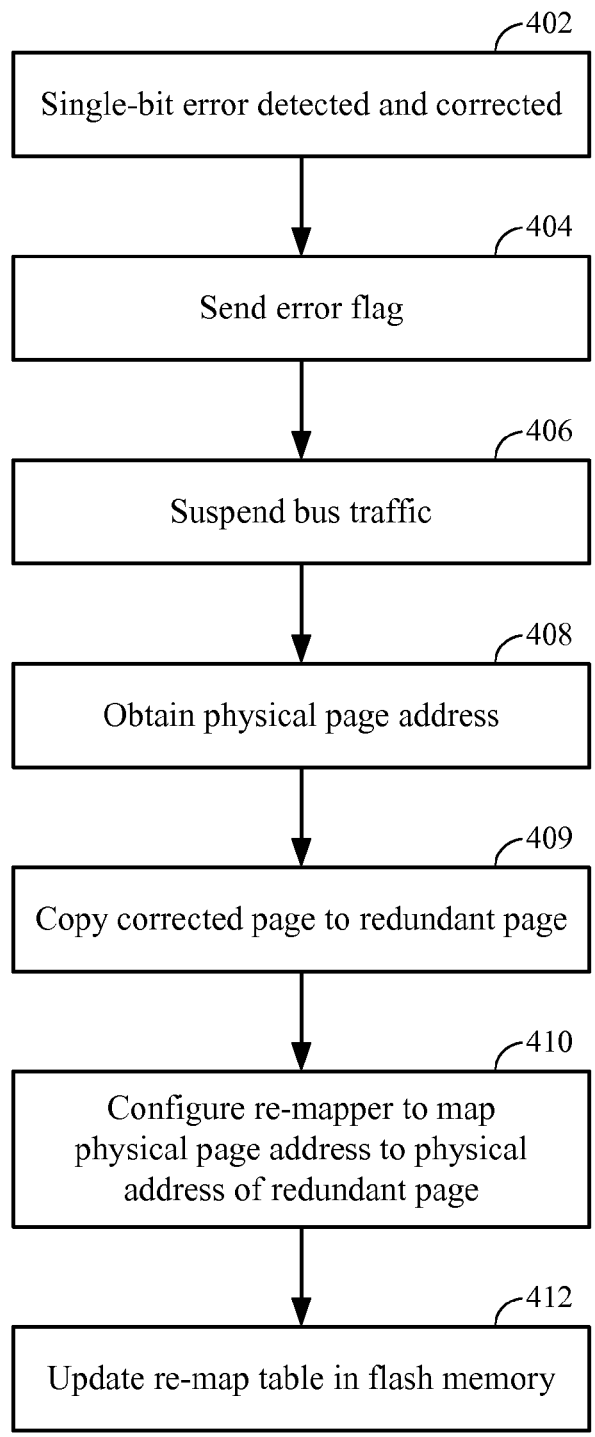
FIG. 4 is a flow diagram illustrating a process to restore pages and re-map page addresses according to another embodiment.

FIG. 4 is a flow diagram illustrating the above-described process. When a single-bit error is detected and corrected during a read operation on system memory (402), the system memory sends an error flag (404) and normal traffic is suspended on the system bus (406). The page address associated with the single-bit error is obtained (408). The CPU 110 copies the entire contents of the corrected page to a redundant page (409). The re-mapper 122 is configured so that the physical page address associated with the single-bit error is now mapped to the physical address of the redundant page (410). The re-map table in the non-volatile memory (e.g., NAND flash memory 104) is updated to reflect this new mapping (412).

The order of steps shown in FIG. 4 is not meant to necessarily imply a corresponding time order. For example, the step 410 may occur before the step 409, where the step 409 is a store operation of the corrected page to its old physical page address. Because of the configuration of the re-mapper 122, the store operation proceeds normally, but the contents of the corrected page is stored at the location (physical page address) of the redundant page in a manner transparent to the CPU 110.

The CPU 110 handling the recovery operations described in steps 306 through 316 and 406 through 412 may be as illustrated in FIG. 1 comprising a single processor system, or the CPU 110 may be an adjunct processor working in cooperation with a primary CPU, or also a multiple CPU cluster.

Executable instructions for performing the above-described processes may be stored in one or more memory systems, such as for example the SRAM 112, the ROM 114, the flash memory 104, or the system memory 108. Such memory systems may be referred to as non-transitory computer readable storage media. (Although, the non-transitory feature of the system memory 108 when such memory is volatile holds when power is available to the system memory 108.)

Figure 5:
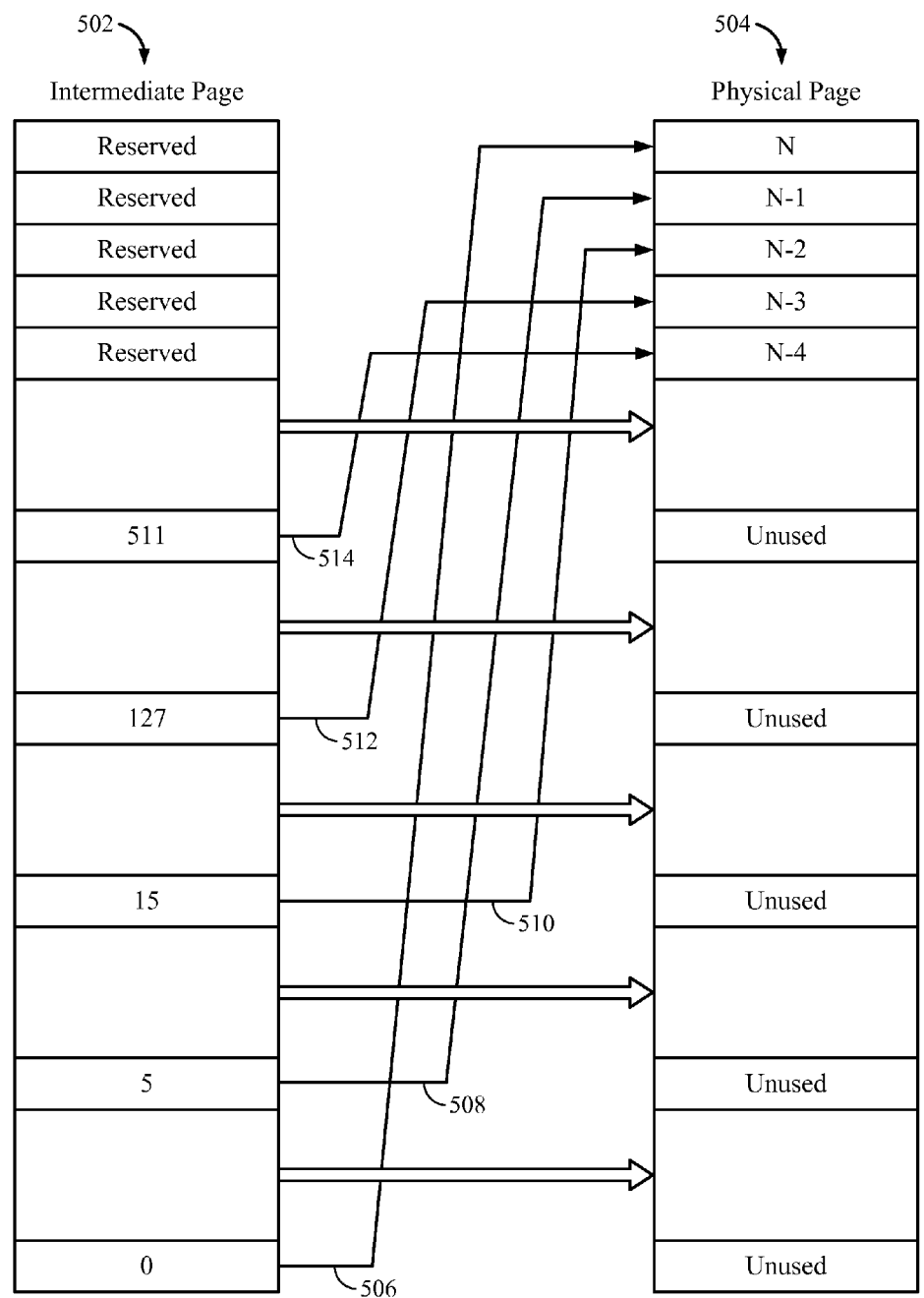
FIG. 5 illustrates a mapping of page addresses according to an embodiment.

FIG. 5 illustrates a mapping of page addresses implemented by the re-mapper 122. The left column, labeled 502 and headed "intermediate page", represents the page address provided as input to the re-mapper 122. The right column, labeled 504 and headed "physical page", represents the page address provided as output of the re-mapper 122. For some embodiments, the page address associated with an address may be the upper 23 bits of the address. The arrows in FIG. 5 indicate the mapping, where the broad arrows represent the identity mapping, mapping blocks to contiguous page addresses. The individually labeled arrows 506, 508, 510, 512, and 514 represent mappings, respectively, of the page addresses 0, 5, 15, 127, and 511 to the higher addresses in the physical page column 504. Accordingly, in the embodiment represented by FIG. 5, the higher addresses in the intermediate page column 502 are reserved for use as redundant pages.

A page address mapping, such as the one illustrated in FIG. 5, may be built over time as read operations on the system memory 108 reveals pages for which there are an unacceptably high rate of bit errors, and the processes implemented by boxes 314 and 410 build up the mappings. Some of these mappings may also be developed by the CPU 110 periodically querying the system memory 108 to determine single-bit failure history. When patterns of repeated single-bit errors within the same page exceed a count threshold, indicating degradation of a particular bit within a page, then that page may be declared bad and re-mapped. Future accesses to such pages may be avoided, where the CPU 110 reconfigures the re-mapper 122 to permanently avoid these pages. Querying does not require a boot up of the system, and the system may continuously adapt while remaining powered on indefinitely. The CPU 110 may store in non-volatile memory, such as the flash memory 104, a record of such bit locations and their associated pages that have been declared bad.

Figure 6:
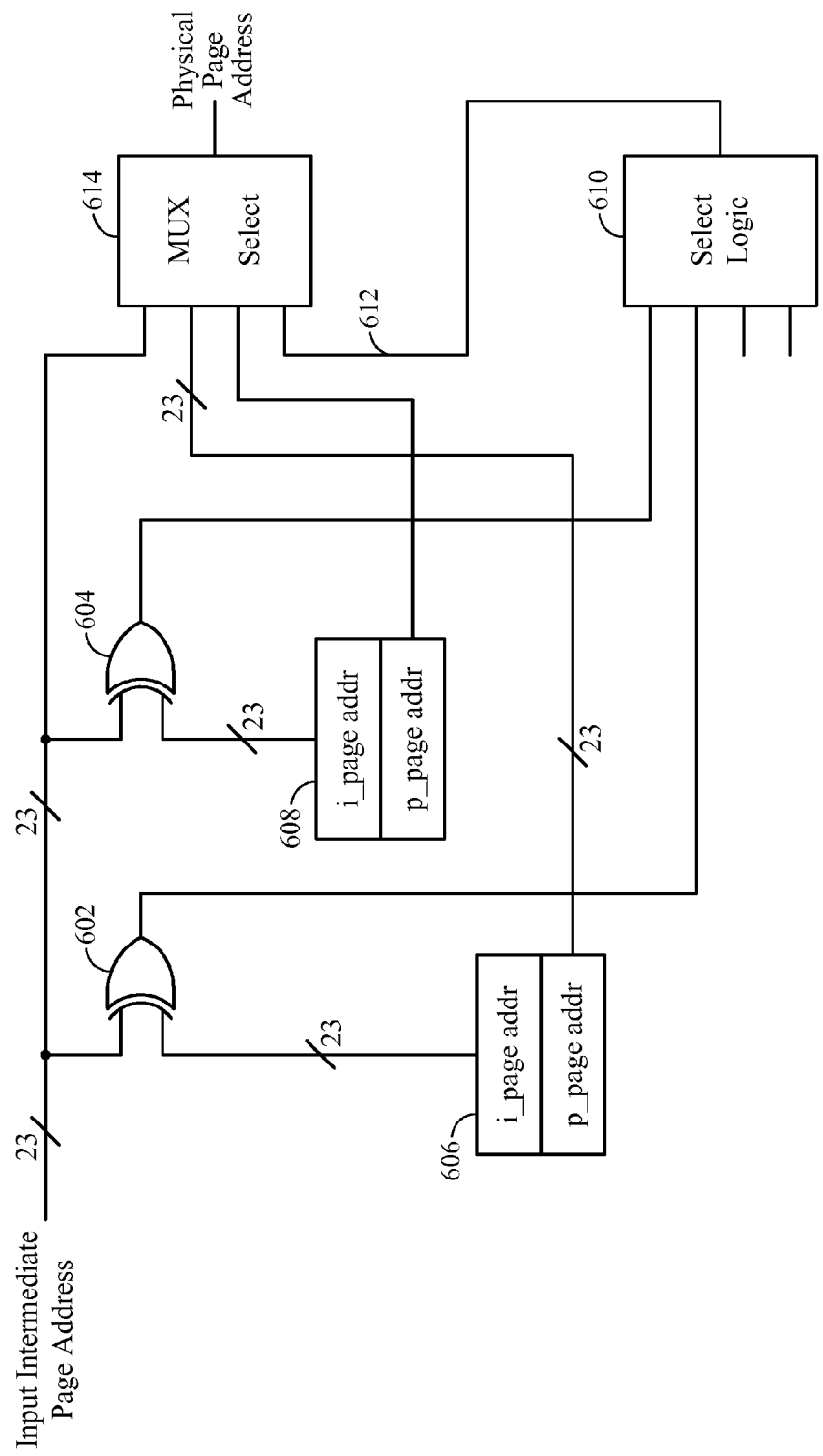
FIG. 6 illustrates a portion of a re-mapper according to an embodiment.

FIG. 6 illustrates a more detailed view of the re-mapper 122. For brevity in notation, the terms "i_page addr" and "p_page addr" appearing in FIG. 6 represent, respectively, the intermediate page address and the physical page address. In the particular embodiment of FIG. 6, a page address is represented with 23 bits. An intermediate page address provided as input to the re-mapper 122 fans out to a bank of comparators that compare the input intermediate page address against various intermediate page addresses that have been pre-programmed in the re-mapper 122 as a result of the processes 314 and 410 discussed previously. For ease of illustration, only two banks of comparators, labeled 602 and 604 are shown, but in practice there will be considerably more such banks of comparators.

Register files 606 and 608, which may physically be part of a single register file, store the mappings. For example, the register file 606 stores an intermediate page address and the physical page address to which it is mapped, and this mapping is associated with the comparator 602. If the comparator 602 indicates a match of the input intermediate page address with the intermediate page address stored in the register file 606, then the comparator 602 provides a signal to the select logic indicating a match. The select logic provides an output signal indicative of this match to the select port 612 of the multiplexer 614. The multiplexer 614 then provides as output the physical page address stored in the register file 606 associated with the comparator 602 for which there is a match. If none of the comparator banks provide a match, then the multiplexer 614 simply propagates as output the input intermediate page address. No arithmetic or shift functions are employed in the particular embodiment of FIG. 6.

Figure 8:
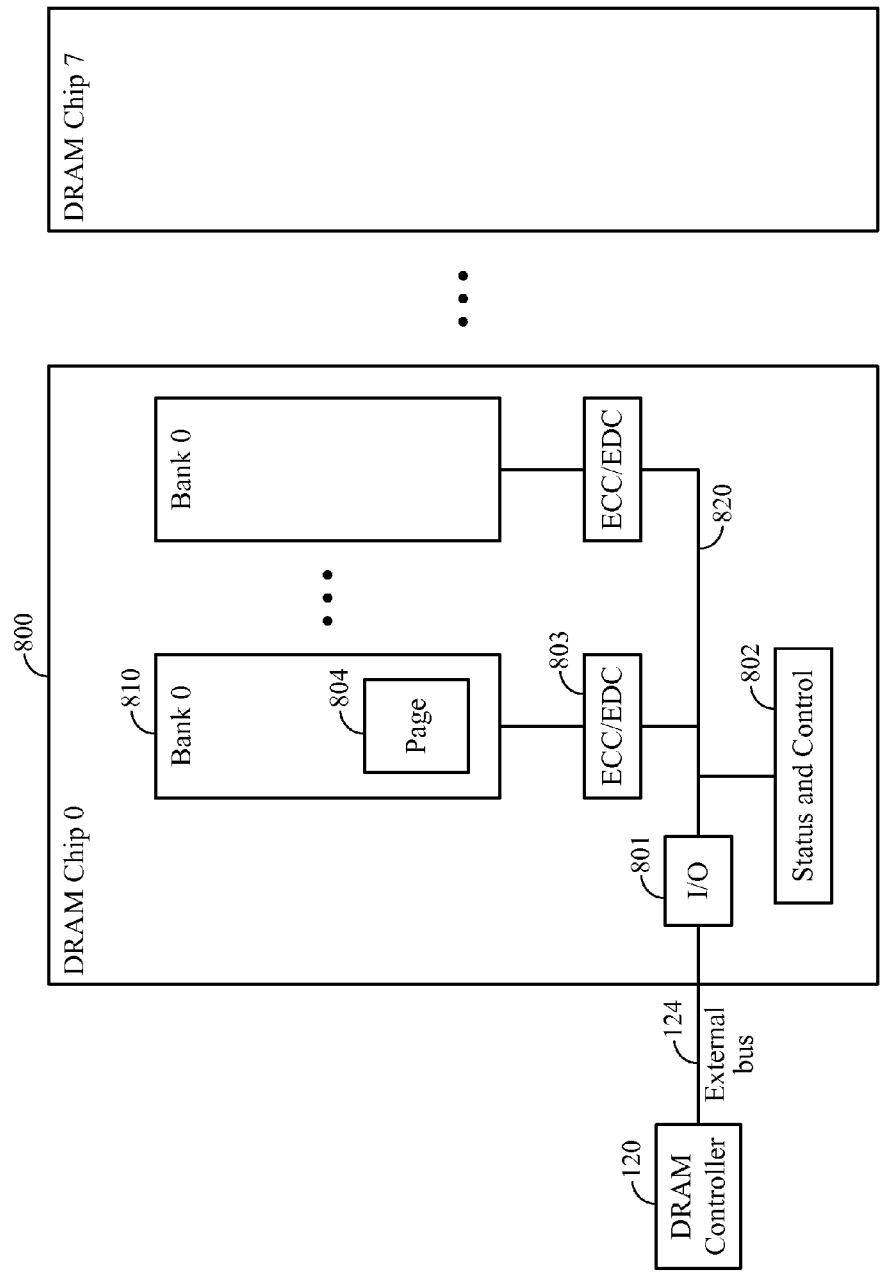
FIG. 8 illustrates a DRAM system memory according to an embodiment.

FIG. 8 illustrates the DRAM system memory 108, comprising multiple DRAM chips. There are eight DRAM chips in the example of FIG. 8. A DRAM chip, labeled 800, is shown in more detail. The DRAM chip 800 comprises multiple banks, where eight banks are shown in the example of FIG. 8, with bank 810 shown in more detail. Each bank includes multiple pages, where one such page labeled 804 is illustrated in the bank 810. A subset or portion of the pages may arbitrarily be assigned as reserved for redundant pages.

An error correction code and detection circuit ECC/EDC 803 corrects single-bit errors and detects multiple-bit errors. Error status, including error page locations, is maintained (stored) in the status and control unit 802. Because the system memory 108 includes volatile memory, the error status information is volatile and is lost in the absence of power. The CPU 110 reads the error status information via the Input/Output (I/O) interface 801 to create the mappings as described previously, such as for example the mappings 506, 508, 510, 512, and 514 in FIG. 5. The CPU 110 also updates the re-map table in the non-volatile flash memory 104. In this embodiment the ECC/EDC unit 803 is contained within the DRAM chip 800. In another embodiment the ECC/EDC 803 may be contained within the SOC 102.

Figure 9:
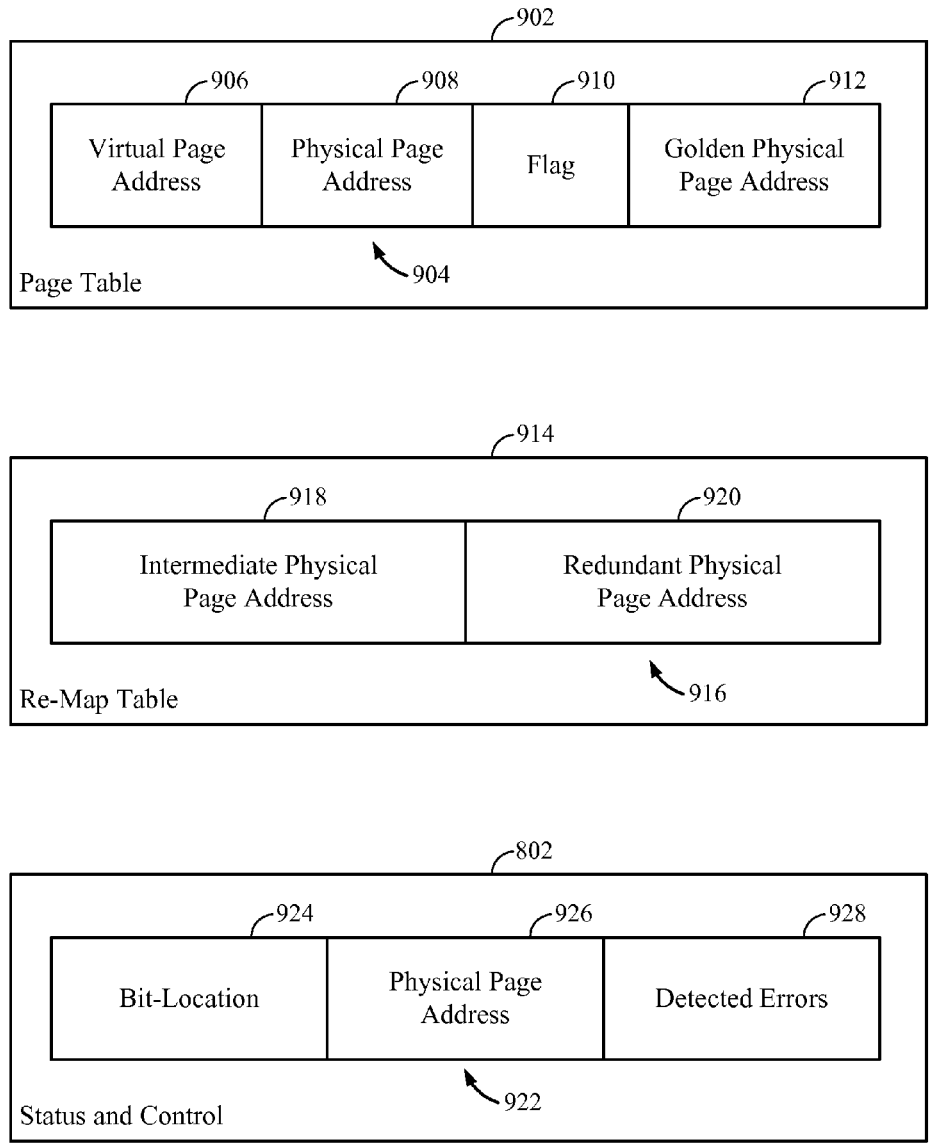
FIG. 9 illustrates various data structures according to an embodiment.

FIG. 9 illustrates various data structures that may be used in one or more embodiments. A page table 902 may be used to store the mappings (correspondences) among the virtual page addresses, physical page addresses in system memory, and the physical addresses of golden pages. The page table 902 comprises entries, such as for example the entry 904. The entry 904 comprises a field 906 to store a virtual page address, a field 908 to store a physical page address in system memory (e.g., the DRAM system memory 108) to which the virtual page address is mapped, a field 910 to store a flag to indicate whether the page associated with the physical page address of the field 908 has been backed up as a golden page in non-volatile memory, and a field 912 to store the physical address of the golden page. Other types of data structures may be used to store these mappings, such as for example a linked list, so that in general the references to a page table as used in the above-described embodiments may include data structures other than a table data structure.

An example of a re-map table 914 is illustrated in FIG. 9, in which an entry 916 comprises a field 908 to store an intermediate physical page address, and the field 920 stores the physical address of the redundant page to which the intermediate physical page address is mapped. Data structures other than a table data structure may be used to store the mappings of the re-map table 914.

The status and control unit 802 stores error status information. The error status information may be stored as different types of data structures, where for example a table data structure is illustrated in FIG. 9, where entry 922 serves as an example. This entry comprises a field 924 to store the location of a memory cell for which an error has been detected, a field 926 to store the physical address of the page associated with the memory cell indicated in the field 924, and the field 928 for keeping track of the number of times an error has been detected for that memory cell. As described above with respect to the process outlined in FIG. 4, a page having a single-bit error may be declared bad if the number of detected errors represented in the field 928 for some particular bit location exceeds a predetermined threshold.

The order of the various fields shown in the data structures of FIG. 9 is for illustration only, and is not meant to imply that the first field serves as an index, or that other fields cannot serve as an index. For example, the entry 904 with the field 906 is not meant to imply that accessing an entry in the page table 902 is always obtained by matching a particular virtual page address to the values stored in the first field of the entries in the page table 902.

Figure 7:
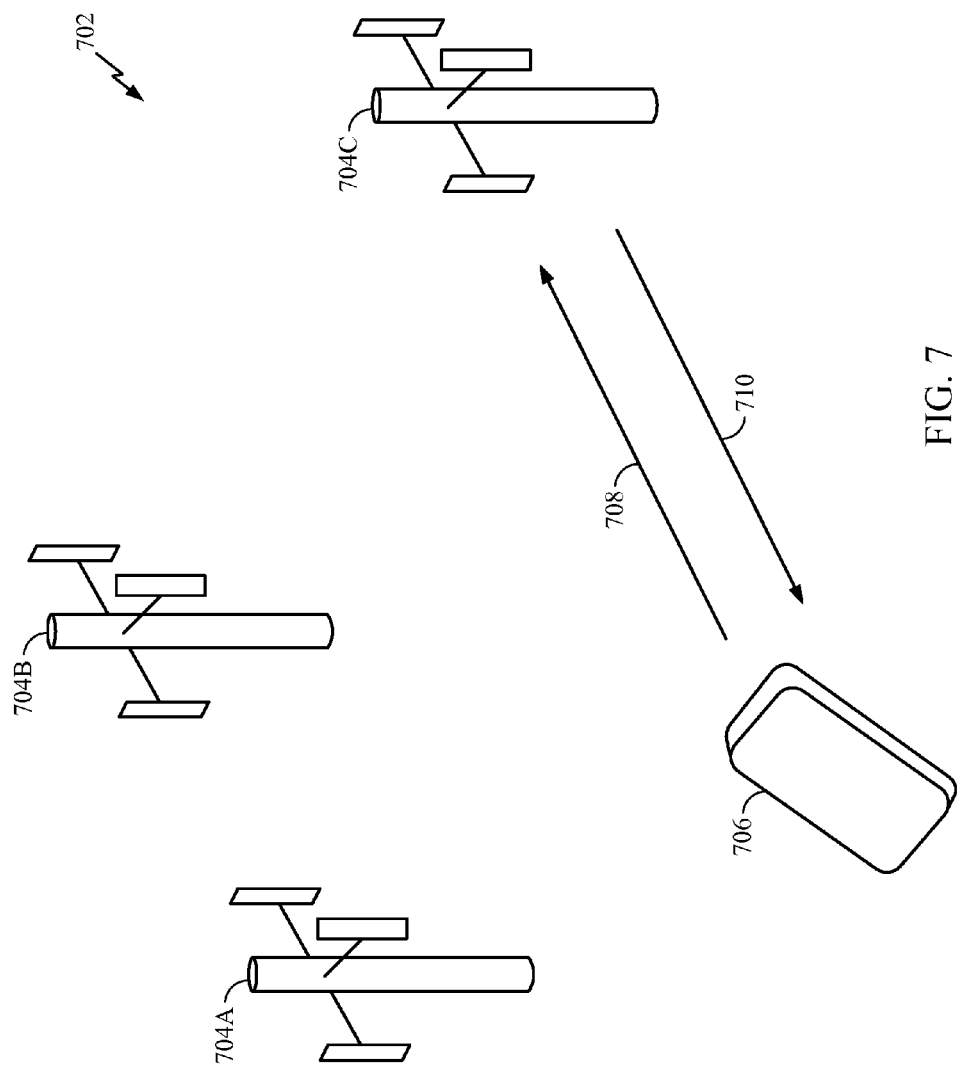
FIG. 7 illustrates a communication system in which embodiments may find application.

FIG. 7 illustrates a wireless communication system in which embodiments may find application. FIG. 7 illustrates a wireless communication network 702 comprising base stations 704A, 704B, and 704C. FIG. 7 shows a communication device, labeled 706, which may be a mobile communication device such as a cellular phone, a tablet, or some other kind of communication device suitable for a cellular phone network, such as a computer or computer system. The communication device 706 need not be mobile. In the particular example of FIG. 7, the communication device 706 is located within the cell associated with the base station 704C. Arrows 708 and 710 pictorially represent the uplink channel and the downlink channel, respectively, by which the communication device 706 communicates with the base station 704C.

Embodiments may be used in data processing systems associated with the communication device 706, or with the base station 704C, or both, for example. FIG. 7 illustrates only one application among many in which the embodiments described herein may be employed.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in either volatile or nonvolatile memory, including RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. Accordingly, an embodiment of the invention can include a computer readable media embodying a method for multiple-bit dram error recovery. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A system comprising:
   a system memory comprising an error detection circuit, the system memory comprising volatile memory;
   a memory controller coupled to the system memory;
   a processor;
   a re-mapper coupled to the processor and to the memory controller, the re-mapper to store mappings of physical page addresses;
   a non-volatile memory; and
   a memory comprising stored instructions, wherein in response to the error detection circuit detecting a multiple-bit error in a page residing in the system memory, the page having a first physical page address, the stored instructions when executed by the processor cause the system to perform a procedure comprising:
      looking up in a page table if a golden page associated with the first physical page address resides in the non-volatile memory;
      copying the golden page to a redundant page in the system memory provided the golden page resides in the non-volatile memory, the redundant page having a second physical page address; and
      configuring the re-mapper to map the first physical page address to the second physical page address when the processor performs a memory operation indicating the first physical page address, wherein the re-mapper provides the second physical page address to the memory controller.

2. The system of claim 1, the procedure further comprising:
   updating a re-map table to store the mapping of the first physical page address to the second physical page address.

3. The system of claim 2, wherein the re-map table is stored in the non-volatile memory.

4. The system of claim 1, the stored instructions comprising further instructions, wherein in response to the error detection circuit detecting and correcting a single-bit error in a second page to provide a corrected page, the second page residing in the system memory and not backed up in the non-volatile memory, the second page having a third physical page address, the further instructions when executed by the processor cause the system to perform a procedure comprising:
   storing the corrected page in a second redundant page in the system memory, the second redundant page having a fourth physical page address; and
   configuring the re-mapper to map the third physical page address to the fourth physical page address when the processor performs a memory operation indicating the third physical page address, wherein the re-mapper provides the fourth physical page address to the memory controller.

5. The system of claim 4, the procedure further comprising:
   updating a re-map table in the non-volatile memory to store the mapping of the first physical page address to the second physical page address; and updating the re-map table to store the mapping of the third physical page address to the fourth physical page address.

6. The system of claim 1, the system comprising a first die and a second die, the first die comprising the processor, and the second die comprising the system memory and the error detection circuit.

7. The system of claim 1, wherein the system comprises a device selected from a group consisting of a cellular phone, a base station, and a computer system.

8. A non-transitory computer-readable memory comprising stored instructions that, when executed by a processor in response to an error detection circuit detecting a multiple-bit error in a page residing in a volatile memory, cause a system to perform a method comprising:
looking up in a page table stored in the volatile memory if a golden page associated with a physical page address of the page resides in a non-volatile memory;
copying the golden page to a redundant page in the volatile memory provided the golden page resides in the non-volatile memory; and
configuring a re-mapper to map the physical page address of the page to a physical page address of the redundant page when the processor performs a memory operation indicating the physical page address of the page, wherein the re-mapper provides the physical page address of the redundant page to a memory controller of the volatile memory.

9. The non-transitory computer-readable memory of claim 8, the method further comprising:
updating a re-map table in the non-volatile memory to store the mapping of the physical page address of the page to the physical page address of the redundant page.

10. The non-transitory computer-readable memory of claim 9, the method further comprising:
detecting and correcting a single-bit error in a second page residing in the volatile memory for which no corresponding golden page resides in the non-volatile memory;
storing a corrected version of the second page in a second redundant page in the volatile memory; and
configuring the re-mapper to map a physical page address of the second page to a physical page address of the second redundant page when the processor performs a memory operation indicating the physical page address of the second page, wherein the re-mapper provides the physical page address of the second redundant page to the memory controller of the volatile memory.

11. The non-transitory computer-readable memory of claim 10, the method further comprising:
updating the re-map table to store the mapping of the physical page address of the second page to the physical page address of the second redundant page.

12. A method comprising:
detecting by an error detection circuit a multiple-bit error in a page residing in a volatile memory;
looking up in a page table stored in the volatile memory if a golden page associated with a physical page address of the page resides in a non-volatile memory;
copying the golden page to a redundant page in the volatile memory provided the golden page resides in the non-volatile memory; and
configuring a re-mapper to map the physical page address of the page to a physical page address of the redundant page when a memory operation on the volatile memory indicates the physical page address of the page, wherein the re-mapper provides the physical page address of the redundant page to a memory controller of the volatile memory.

13. The method of claim 12, further comprising:
updating a re-map table in the non-volatile memory to store the mapping of the physical page address of the page to the physical page address of the redundant page.

14. The method of claim 13, further comprising:
detecting and correcting by the error detection circuit a single-bit error in a second page residing in the volatile memory for which no corresponding golden page resides in the non-volatile memory;
storing a corrected version of the second page in a second redundant page in the volatile memory; and
configuring the re-mapper to map a physical page address of the second page to a physical page address of the second redundant page when a processor performs a memory operation indicating the physical page address of the second page, wherein the re-mapper provides the physical page address of the second redundant page to the memory controller of the volatile memory.

15. The method of claim 14, further comprising:
updating the re-map table to store the mapping of the physical page address of the second page to the physical page address of the second redundant page.

16. The method of claim 15, further comprising:
loading the re-map table from the non-volatile memory into a local memory of the processor upon a system boot up; and
configuring by the processor the re-mapper based on the re-map table loaded into the local memory.

17. An apparatus comprising:
means for detecting a multiple-bit error in a page residing in a volatile memory;
means for looking up in a page table to determine if a golden page associated with a physical page address of the page resides in a non-volatile memory;
means for copying the golden page to a redundant page in the volatile memory provided the golden page resides in the non-volatile memory; and
means for mapping the physical page address of the page to a physical page address of the redundant page when a memory operation on the volatile memory indicates the physical page address of the page, wherein the means for mapping provides the physical page address of the redundant page to a memory controller of the volatile memory.

18. The apparatus of claim 17, further comprising:
means for updating a re-map table in the non-volatile memory to store the mapping of the physical page address of the page to the physical page address of the redundant page.

19. The apparatus of claim 18, further comprising:
means for detecting and correcting a single-bit error in a second page residing in the volatile memory for which no corresponding golden page resides in the non-volatile memory; and
means for storing a corrected version of the second page in a second redundant page in the volatile memory;
the means for mapping comprising a mapping of a physical page address of the second page to a physical page address of the second redundant page when a memory operation indicates the physical page address of the second page, wherein the means for mapping provides the physical page address of the second redundant page to the memory controller of the volatile memory.

20. The apparatus of claim 19, further comprising:
means for configuring upon a system boot up the means for mapping based on the re-map table.

\* \* \* \* \*